United States Patent [19]
Mateja et al.

[11] Patent Number: 6,134,689
[45] Date of Patent: Oct. 17, 2000

[54] METHOD OF TESTING LOGIC DEVICES

[75] Inventors: Michael Alan Mateja; John C. Potter, both of Austin, Tex.

[73] Assignee: Motorola Inc., Schaumburg, Ill.

[21] Appl. No.: 09/022,397

[22] Filed: Feb. 12, 1998

[51] Int. Cl.$^7$ .............................. G01R 31/28; G06F 11/00
[52] U.S. Cl. .............................................................. 714/736
[58] Field of Search ..................... 714/736, 719, 714/724, 726, 735, 30; 326/16; 324/158.1

[56] References Cited

U.S. PATENT DOCUMENTS

| | | | |
|---|---|---|---|
| 4,853,928 | 8/1989 | Williams | 714/736 |
| 5,574,853 | 11/1996 | Barch et al. | 714/30 |
| 5,592,493 | 1/1997 | Crouch et al. | 714/729 |
| 5,633,606 | 5/1997 | Gaudet et al. | 327/202 |
| 5,684,808 | 11/1997 | Valind | 714/726 |

*Primary Examiner*—Albert De Cady
*Assistant Examiner*—Shelly A Chase

[57] ABSTRACT

A method of testing a logic device that includes the steps of identifying a first test vector corresponding to a test failure resulting from testing of the logic device (10), converting the first test vector from an input pin format into state data associated with the logic device, and searching the internal state data to identify a set of last shift transitions. A method of making a logic device having a specification frequency, the method including the steps of providing an integrated circuit, testing the integrated circuit using a scan test pattern at a frequency at least as great as the specification frequency, performing a diagnosis procedure to produce a diagnosis result, and producing the integrated circuit in a final form after the diagnosis result indicates a non-functional problem. The diagnosis result indicates at least one of a non-functional problem and a speed problem.

14 Claims, 3 Drawing Sheets

| BIT# | SHIFT-IN RAW DATA | CONTROL POINT STORED DATA | CONTROL POINT NAMES REGISTERS IN SCAN CHAIN |
|---|---|---|---|
| 0 | 0 | 1 | R1 |
| 1 | 0 | 0 | R2 |
| 2 | 1 | 0 | R3 |
| 3 | 1 | 1 | R4 |
| 4 | 1 | 0 | R5 |
| 5 | 0 | 0 | R6 |
| 6 | 1 | 0 | R7 |
| 7 | 1 | 1 | R8 |
| 8 | 0 | 1 | R9 |

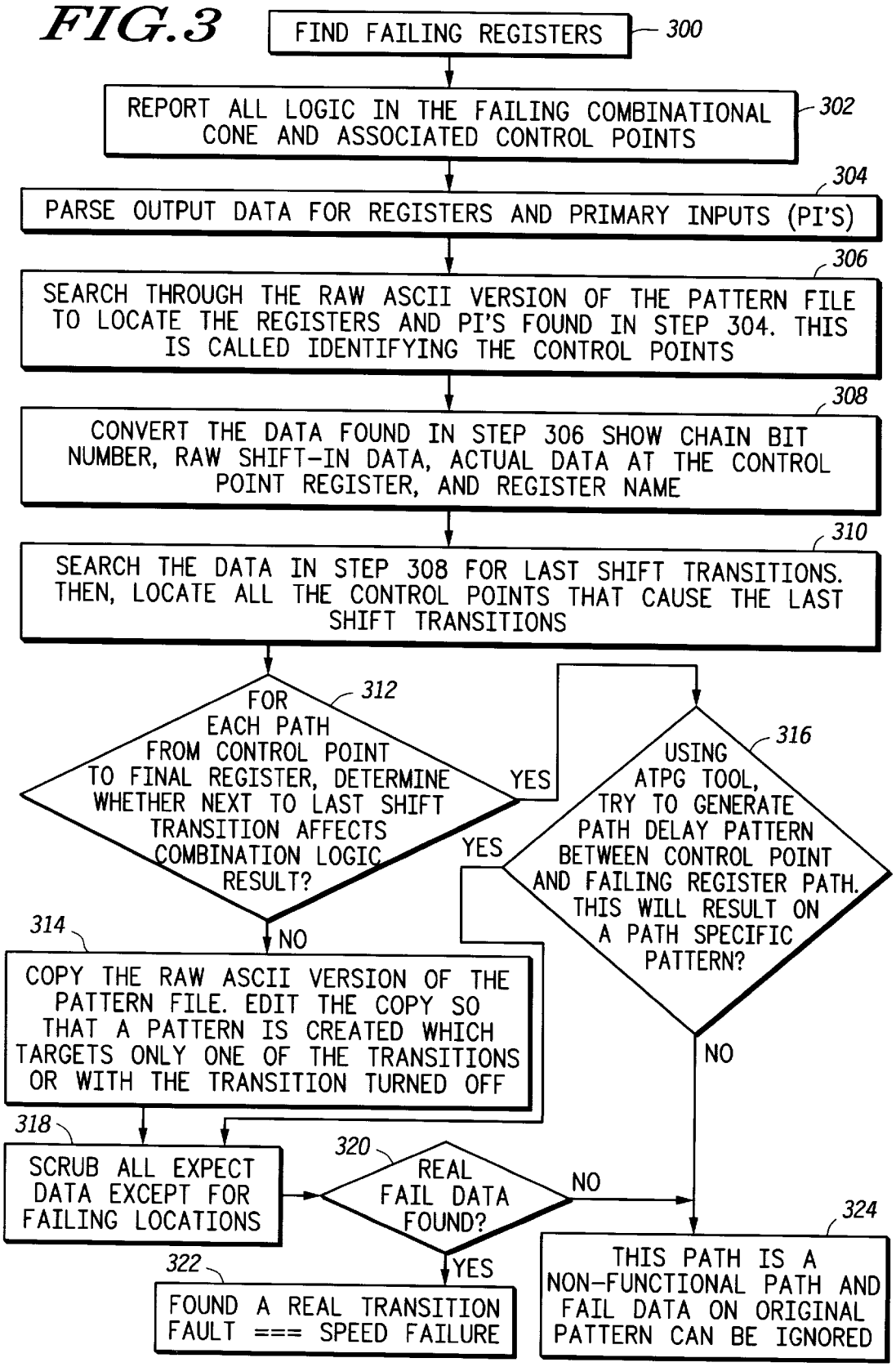

a non-functional problem. The diagnosis result indicates at least one of a non-functional problem and a speed problem.

It should be noted that the particular terms and expressions employed and the particular structural and operational details disclosed in the detailed description and accompanying drawings are for illustrative purposes only and are not intended to in any way limit the scope of the invention as described in the appended claims.

Referring to FIG. 1, an embodiment of a logic device having scan testing circuitry is illustrated. The logic device 10 includes a inputs 12, 14, a first scan chain 102, a second scan chain 104, combinational logic 22, and outputs 98, 100. The first scan chain 102 includes a plurality of registers 24, 26, 28, 30, a demultiplexer 18, and multiplexers 40, 42, and 44. The second scan chain 104 includes a plurality of registers 32, 34, 36, 38, a demultiplexer 20, and multiplexers 46, 48, and 50. The demultiplexer 18 of the first scan chain 102 is coupled to the first input 12, and the demultiplexer 20 of the second scan chain 104 is coupled to the second input 14. The first scan chain 102 is connected to the combinational logic module 22 via signal lines 54, 56, 58, 60, 62, 64, 66, and output 98. The second scan chain 104 is connected to the combinational logic module 22 via signal lines 70, 72, 74, 76 78, 80, 84, and output 100. The first scan chain 102 provides the first output 98 and the second scan chain 104 provides the second output 100. The combinational logic module 22 in an illustrative embodiment is a complex processing device, such as an embedded microprocessor. While the logic device 10 illustrated in FIG. 1 has only two scan chains 102, 104, it is contemplated that the logic device 10 may include more than two scan chains. In one particular logic device, thirty different scan chains are used to perform scan testing. In addition, although only four registers are shown for each scan chain 102, 104, it is to be understood that each scan chain can include many more registers arranged in a shift register configuration. The number of registers is to match the number of states within the combinational logic module 22 that are to be tested.

During operation, the combinational logic module 22 may be operated in a processing mode or a scan testing mode. To operate the combinational logic module 22 in the scan testing mode, the scan enable line 16 is activated and a test pattern, such as a bit pattern used to check for logic elements having internal nodes stuck at a particular logic value known as "stuck at" test patterns, is loaded into the scan chains 102, 104, via the inputs 12, 14. To execute a test corresponding to the loaded test pattern, the scan enable line 16 is deactivated, placing the combinational logic module 22 into a processing mode. The test pattern data is then input into the combinational logic module 22 from the registers 24–30, 32–38 of the scan chains 102, 104 into the combinational logic module 22 and the combinational logic module 22 processes the test pattern data. Next, resulting test data from the combinational logic module 22 is output to the scan chains 102, 104. The resulting test data may then be retrieved from the scan chains 102, 104 via the outputs 98, 100. The resulting test data may then be compared to an expected output result for the particular test pattern to determine if the particular test passed or failed.

Referring to FIG. 2, a flow chart of a particular method of making and testing the logic device 10 of FIG. 1 is illustrated. At step 200, a particular integrated circuit of the logic device 10 is designed. Next, at step 202, the particular integrated circuit is fabricated. One exemplary method of fabricating the integrated circuit is to create a plurality of lithographic masks from a circuit layout of the integrated

METHOD OF TESTING LOGIC DEVICES

FIELD OF THE INVENTION

The present invention relates to methods of manufacturing and testing logic devices.

BACKGROUND OF THE INVENTION

Many current methods of testing logic devices, such as embedded microprocessors, have been used commercially. One such method is known as scan testing. During scan testing at clock speeds approaching or at the processor speed, it has been historically difficult to diagnose propagation delay failures using certain types of testing patterns, such as stuck-at testing patterns. In addition, due to the large number of elements on many logic devices, it is very difficult to efficiently test all logic combinations. One technique to address this issue, is to selectively test some, but not all, logic combinations of the logic device. However, it would be more desirable to test all logic combinations to improve robustness and quality of the logic device. Another diagnostic testing method for logic devices uses hardware equipment such as microprobes or electronic beam equipment. However, such hardware methods can be expensive and time consuming. Further, in certain cases, these hardware testing methods may not be useful due to physical limitations of an integrated circuit including the logic device under test and limitations of the physical hardware equipment.

Accordingly, there is a need for an improved method of making and testing logic devices.

BRIEF DESCRIPTION OF THE DRAWINGS

While the invention is pointed out with particularity in the appended claims, other features of the invention are disclosed by the following detailed description taken in conjunction with the accompanying drawings, in which:

FIG. 3 is a flow chart of a method of testing a logic device in accordance with an embodiment of the present invention.

DETAILED DESCRIPTION OF THE PREFERRED EMBODIMENTS

Figure 1:
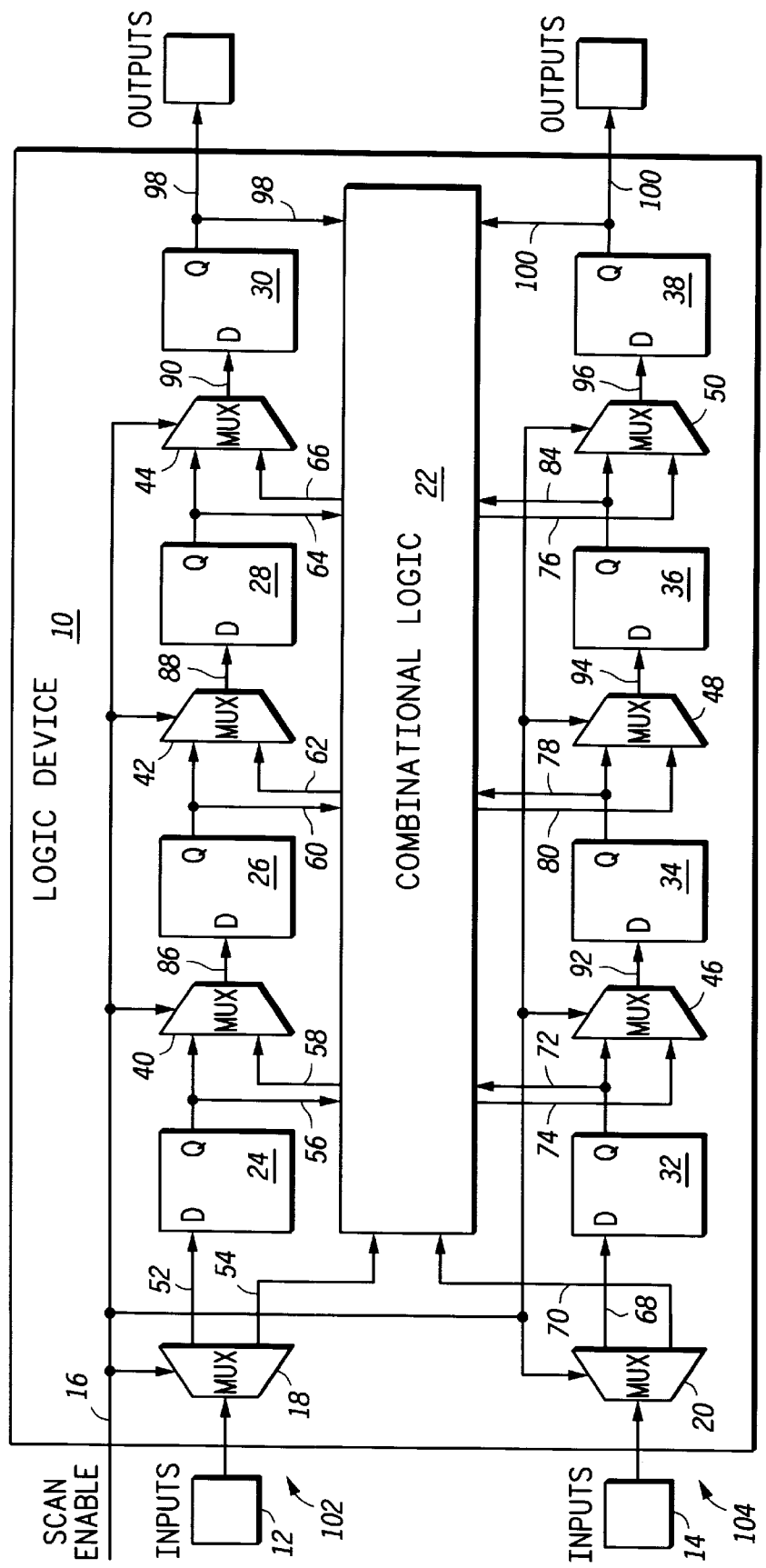
FIG. 1 is a block diagram of an embodiment of a logic device with scan testing circuitry.

Generally, the present invention relates to methods of making and testing logic devices. In accordance with a first aspect of the present invention, the method is a method of testing a logic device that includes the steps of identifying a first test vector corresponding to a test failure resulting from testing of the logic device, converting the first test vector from an input pin format into state data associated with the logic device, and searching the state data to identify a set of last shift transitions.

In accordance with another aspect of the present invention, the method is a method of making a logic device that has a specification frequency. The method includes the steps of providing an integrated circuit, testing the integrated circuit using a scan test pattern at a frequency at least as great as the specification frequency, performing a diagnosis procedure to produce a diagnosis result, and producing the integrated circuit in a final form after the diagnosis result circuit and to pattern and fabricate a semiconductor wafer into a set of integrated circuits utilizing the plurality of lithographic masks. At step 204, diagnostic testing is performed on the fabricated logic device 10 in integrated form. In a particular embodiment, the diagnostic test is a stuck-at test performed using an automated test pattern generation (ATPG) testing tool, such as an ATPG tool available from various commercial tool providers, such as Mentor Graphics. In a particular embodiment, the logic device has a particular specification processing frequency and the diagnostic test is loaded into the logic device 10 and retrieved from the logic device 10 at or above the specification frequency. In this manner, the scan test may be performed very quickly, thereby reducing the cost to test and ultimately manufacture the logic device. Although reference is made to a single fabricated logic device 10, it is contemplated that the test could be performed on many logic devices. In this case, a test failure could be detected using a statistical analysis or other type of correlation method. At decision step 206, a test result from the diagnostic testing step 204 is determined. If the test result is a failure, then processing proceeds to step 208. Otherwise, the step of producing the logic device 10 in final form is performed at step 212.

At step 208, a particular method of performing a diagnostic procedure, as further described with respect to FIG. 3, is performed. The result of the diagnostic procedure of step 208 is either a determination that the failure is a speed error or is a non-functional problem. If the diagnostic result is a non-functional problem, then the final step of producing the logic device 10 in final form is performed, at step 212. If the diagnostic result is a speed related problem, then the step of addressing the speed problem is performed at step 210. Possible methods for addressing the speed error would be to redesign at least a portion of the combinational logic 22 of the logic device 10, adjust the fabrication process, determine usage of the functionality relating to the speed problem, or generating an error report. Depending on the particular method chosen in step 210, processing may iterate back to design step 200.

Figures 2, 4:
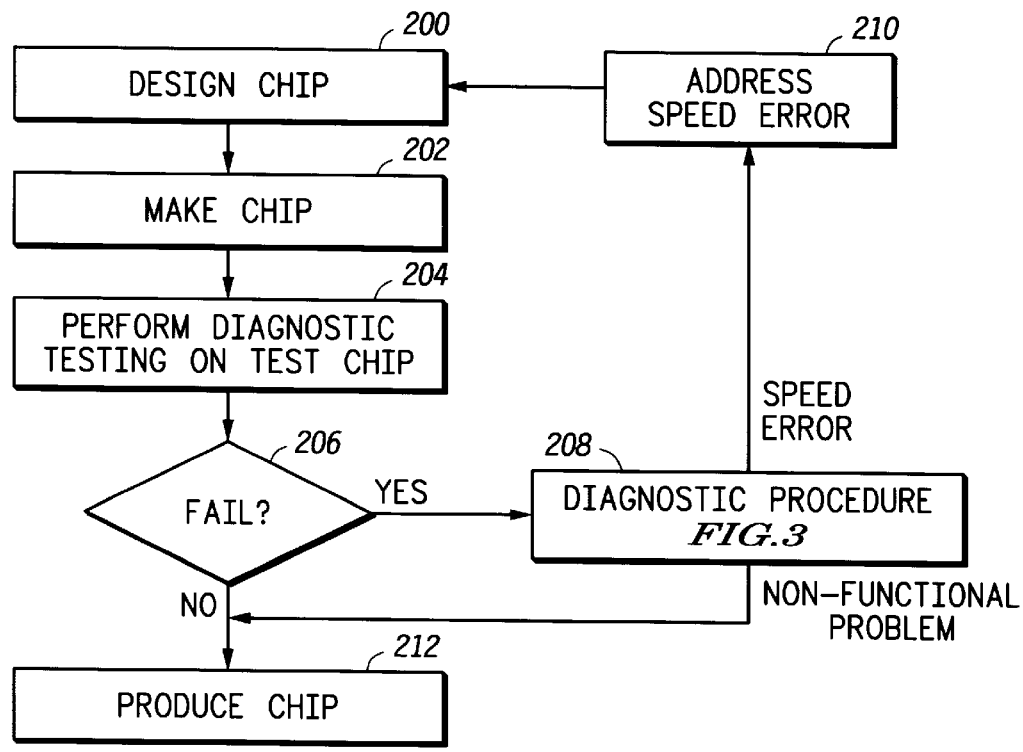
FIG. 2 is a flow chart of a particular method of making a logic device in accordance with an embodiment of the present invention.
FIG. 4 is a general diagram illustrating a state table associated with the logic device of FIG. 1.

Referring to FIG. 3, the diagnosis procedure referenced in FIG. 2 is further illustrated. At step 300, a step of finding all final registers for all testing paths that have failed is performed. At 302, a trace back operation is performed using the ATPG tool, to identify all control points, such as starting registers in scan chains of registers forming a testing path, by filtering out intermediate logic elements, step 304, such as the logic elements of the combinational logic module 22. Examples of starting registers include registers 24 and 32 of the logic device 10 shown in FIG. 1. A cone of logic is a portion of the combinational logic module 22 that consists of logic elements from the final failed register back to the control points and associated sequential logic elements.

The next step is to determine locations of control points within a scan test pattern, at step 306. The scan test pattern may provide data to a plurality of scan chains, such as scan chains 102, 104. Each of the plurality of scan chains includes a plurality of individual test bits. A test vector is a set of bits with at most one bit from each of the plurality of scan chains. Thus, the scan chains correspond to a plurality of different test vectors. The next step is to convert scan test pattern data to form state data identifying scan chain bit number, raw shift-in data, control point stored data prior to failed test execution, and the control point name. An example of such state data is shown in FIG. 4. At step 310, the step of searching the state data from the state table to identify all control points that have a next-to-last to last-state transition referred to as control point transitions is then performed.

The method next determines for each test path from a control point to the final register, whether changing the next-to-last shift and last-shift transition would affect the combination logic 22 result, at decision step 312. If such a transition change would not affect the logic result, then the control point transition is modified, at step 314, and the scan test is re-executed, at 320, focusing on data from the targeted control point transition, at step 318. If the re-executed test now passes, then the targeted control point transition is identified as a contributing failure point, at step 322. If the re-executed test fails, then the targeted control point transition is not identified as a contributing failure point. The above process from step 314 to step 322 is repeated for each path identified in step 312.

Referring back to step 312, if the next-to-last-shift and last-shift transition would affect the logic result, then processing for those paths proceeds to step 316. At step 316, for each test path, an automated test pattern generation (ATPG) tool is instructed to generate a test pattern targeting a test path between the control point transition and the final failure register. This tool targets state to next-state transitions. For paths that can not be generated by the ATPG tool, the path is identified as a non-functional path at step 324. If no contributing path can be found in step 312 or step 316, then the original test failure may be ignored. For all generated patterns from the ATPG tool, the initial test is re-executed focusing on data from each targeted control point transition, at step 318. Method steps 320 and 322 are performed as described above.

The above method of making and testing a logic device has many benefits. For example, the above method allows a logic device to be tested at a speed corresponding to the speed of the logic device. Many prior methods only allowed testing at significantly slower clock speeds. Increased testing speed results in lower manufacturing costs for logic devices that require quality testing. In addition, by determining particular delay failure paths, the disclosed method provides valuable information for re-designing or re-evaluating complex logic devices, such as embedded microprocessors. Further, the above method may be conveniently implemented in computer software. This feature provides many benefits with respect to many prior hardware techniques, such as hardware micro-probing and electronic beam probing. The described method implemented in automation software in certain applications can detect logic faults that are difficult to observe or not observable using many alternative hardware testing methods.

Thus, there has been described herein an embodiment including at least one preferred embodiment of an improved method of making and testing a logic device. It will be apparent to those skilled in the art that the disclosed subject matter may be modified in numerous ways and may assume many embodiments other than the preferred form specifically set out and described above. Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

What is claimed is:

1. A method of testing an integrated circuit containing a logic device, said method comprising the steps of:

A) identifying a first test vector corresponding to a test failure resulting from testing of the logic device;

B) converting the first test vector from an input pin format into state data associated with the logic device; and C) searching the state data to identify a set of last shift transitions.

2. The method of claim 1, further comprising the step of:

D) identifying a set of control point transitions in a cone of logic of the logic device based on the last shift transitions.

3. The method of claim 2, which further comprises:

D) generating a follow-up test pattern that targets one of the set of control point transitions, application of the follow-up test pattern to the logic device having the same expected output of the logic device in comparison to application of the first test vector to the logic device.

4. The method of claim 3 which further comprises:

E) testing the logic device utilizing the follow-up test pattern;

F) comparing a follow-up output generated in response to testing the logic device utilizing the follow-up test pattern against a follow-up expected result; and G) detecting a speed failure based on the comparison of step (F).

5. The method of claim 4 which further comprises:

H) repeating steps (A) through (F) as an inner loop selecting a different test pattern as the follow-up test patterns.

6. The method of claim 3 wherein step (D) comprises:

producing the follow-up test pattern based on an ASCII version of the first test vector.

7. The method of claim 3 wherein step (D) comprises:

generating a two sample path delay pattern targeting the one of the control point transitions.

8. The method of claim 1, wherein the test failure is a propagation delay failure and wherein the state data includes data stored in a scan register within the logic device.

9. The method of claim 8, further comprising the step of:

D) modifying a circuit layout corresponding to at least a portion of the logic device in response to the delay failure.

10. The method of claim 8, further comprising the step of:

D) generating a report documenting the delay failure.

11. The method of claim 1 which further comprises:

D) testing the logic device by applying the first test vector to the logic device.

12. The method of claim 1, further comprising the step of testing a second logic device using the first test vector.

13. The method of claim 12 wherein:

the test failure is detected when the first logic device and the second logic device fail testing in a substantially similar manner in response to the first test vector.

14. A method of testing a logic device having a specification frequency, the method comprising the steps of:

testing the logic device using a scan test pattern at a frequency at least as great as the specification frequency; and performing a diagnosis procedure to produce a diagnosis result, the diagnosis result indicating at least one of a non-functional problem and a speed problem, the diagnosis procedure including the steps of:

identifying a plurality of control points corresponding to a failed test;

generating a test pattern based on a transition of at least one of the plurality of control points to produce a second scan test pattern; and executing a test on the logic device with the second scan test pattern.

* * * * *

UNITED STATES PATENT AND TRADEMARK OFFICE
CERTIFICATE OF CORRECTION

PATENT NO. : 6,134,689
DATED : October 17, 2000
INVENTOR(S) : Michael Alan Mateja et al.

It is certified that error(s) appear in the above-identified patent and that said Letters Patent are hereby corrected as shown below:

In the Abstract;
Line 8, after "device", add - -(308)- -

Line 9, after "transitions", add - -(312)- -

Line 13, after "specification frequency", add - -(204)- -

Line 14, after "result", add - -(208)- -

Line 16, after "problem", add - -(212)- -

Signed and Sealed this

Eighth Day of May, 2001

NICHOLAS P. GODICI

*Attest:*

*Attesting Officer*     *Acting Director of the United States Patent and Trademark Office*